United States Patent
Yoshikawa et al.

(10) Patent No.: US 8,648,674 B2
(45) Date of Patent: Feb. 11, 2014

(54) FILTER CIRCUIT, AND WIRELESS COMMUNICATION MODULE AND WIRELESS COMMUNICATION DEVICE THAT USES THE SAME

(75) Inventors: Hiromichi Yoshikawa, Kirishima (JP); Hiroshi Ninomiya, Kirishima (JP); Masafumi Horiuchi, Kirishima (JP)

(73) Assignee: Kyocera Corporation, Kyoto (JP)

( * ) Notice: Subject to any disclaimer, the term of this patent is extended or adjusted under 35 U.S.C. 154(b) by 371 days.

(21) Appl. No.: 13/203,225

(22) PCT Filed: Feb. 17, 2010

(86) PCT No.: PCT/JP2010/052303
§ 371 (c)(1),
(2), (4) Date: Aug. 24, 2011

(87) PCT Pub. No.: WO2010/098237
PCT Pub. Date: Sep. 2, 2010

(65) Prior Publication Data
US 2011/0304410 A1    Dec. 15, 2011

(30) Foreign Application Priority Data

Feb. 25, 2009    (JP) ................................. 2009-041979

(51) Int. Cl.
*H01P 1/20*    (2006.01)
(52) U.S. Cl.
USPC ............................ 333/202; 333/204; 333/212
(58) Field of Classification Search
USPC .......................................... 333/202, 204, 212
See application file for complete search history.

(56) References Cited

U.S. PATENT DOCUMENTS 5,136,269 A  *  8/1992   Seitzer et al. ................. 333/204
(Continued)

FOREIGN PATENT DOCUMENTS

CN         101361219 A    2/2009
EP         0744831 A2     11/1996
(Continued)

OTHER PUBLICATIONS

Chinese language office action dated Jun. 5, 2013, and its English language Statement of Relevance of Non-English References Pursuant to 37 CFR 1398(a)(3)(i) issued in corresponding Chinese application 201080009258.8.

*Primary Examiner* — Robert Pascal
*Assistant Examiner* — Kimberly Glenn
(74) *Attorney, Agent, or Firm* — DLA Piper LLP (US)

(57) ABSTRACT

A filter circuit having two pass bands includes first and second bandpass filters which are connected in parallel with each other. Each of the bandpass filters includes at least a resonator group composed of a plurality of resonators arranged in orderly sequence so as to be coupled to each other to form a pass band, an input terminal coupled to a resonator on an input stage, and an output terminal coupled to a resonator on an output stage. The resonator group is composed of at least one of one or more quarter-wavelength resonators and one or more half-wavelength resonators. The resonator group of at least one of the first bandpass filter and the second bandpass filter includes both one or more quarter-wavelength resonators and one or more half-wavelength resonators.

3 Claims, 19 Drawing Sheets

(56) References Cited

U.S. PATENT DOCUMENTS

| | | | |
|---|---|---|---|
| 5,926,466 A | 7/1999 | Ishida et al. | 370/280 |
| 6,147,571 A * | 11/2000 | Kitazawa et al. | 333/126 |
| 7,126,444 B2 * | 10/2006 | Fukunaga et al. | 333/204 |
| 7,656,254 B2 | 2/2010 | Takei et al. | |
| 2004/0095212 A1 * | 5/2004 | Iwasaki et al. | 333/204 |
| 2008/0224800 A1 | 9/2008 | Takei et al. | 333/204 |

FOREIGN PATENT DOCUMENTS

| | | |
|---|---|---|
| JP | 08-321738 | 12/1996 |
| JP | 10-041701 | 2/1998 |
| JP | 10-242706 | 9/1998 |
| WO | WO 2008/038443 A1 | 4/2008 |

\* cited by examiner

FILTER CIRCUIT, AND WIRELESS COMMUNICATION MODULE AND WIRELESS COMMUNICATION DEVICE THAT USES THE SAME

CROSS-REFERENCE TO THE RELATED APPLICATIONS

This application is a national stage of international application No. PCT/JP2010/052303, filed on Feb. 17, 2010, and claims the benefit of priority under 35 USC 119 to Japanese Patent Application No. 2009-041979, filed on Feb. 25, 2009, the entire contents of which are incorporated herein by reference.

TECHNICAL FIELD

The present invention relates to a filter circuit having two pass bands, and a wireless communication module and a wireless communication device that use the filter circuit.

BACKGROUND ART

In the interest of miniaturization of high-frequency circuits, there is an increasing demand for a dual band filter having two pass bands. As such a dual band filter, for example, there is proposed a dual band filter in which two pass bands are formed by utilizing a fundamental resonant mode and a high-order resonant mode of a dielectric resonator (refer to Patent Literature 1, for example).

CITATION LIST

Patent Literature

Patent Literature 1: Japanese Unexamined Patent Publication JP-A 10-41701 (1998)

SUMMARY OF INVENTION

Technical Problem

However, a problem encountered in a conventional dual band filter such as proposed in Patent Literature 1 is that the use of the fundamental resonant mode and the high-order resonant mode renders it impossible to arbitrarily set frequencies for two pass bands.

The invention has been devised in view of the problem associated with the conventional art as mentioned above, and accordingly its object is to provide a filter circuit capable of arbitrarily setting frequencies for two pass bands and ensuring an adequate amount of attenuation in a frequency region between the two pass bands, and a wireless communication module and a wireless communication device that use the filter circuit.

Solution to Problem

The invention provides a filter circuit having two pass bands, comprising:
a first bandpass filter having a pass band of a first frequency band; and
a second bandpass filter having a pass band of a second frequency band which is higher in frequency than the first frequency band, the first bandpass filter and the second bandpass filter being connected in parallel with each other,
each of the first bandpass filter and the second bandpass filter comprising at least a resonator group composed of a plurality of resonators arranged in orderly sequence so as to be coupled to each other to form a pass band; an input terminal coupled to a resonator on an input stage of the plurality of resonators of the resonator group; and an output terminal coupled to a resonator on an output stage of the plurality of resonators of the resonator group,
the resonator group being composed of at least one of one or more quarter-wavelength resonators which are short-circuited at one end and one or more half-wavelength resonators which are opened at both ends,
the resonator group of at least one of the first bandpass filter and the second bandpass filter comprising both the one or more quarter-wavelength resonators and the one or more half-wavelength resonators, the respective half-wavelength resonators having one end coupled to an adjacent resonator at the input terminal side or to the input terminal and has other end coupled to an adjacent resonator at the output terminal side or to the output terminal, a number of the half-wavelength resonators included in the resonator group of the first bandpass filter and a number of the half-wavelength resonators included in the resonator group of the second bandpass filter being so determined as to fulfill a condition given in an equation form as: $a \times b \times c \times d \times e \times f \times g \times h \times j \times k \times m = -1$, where, in the first bandpass filter, "a" represents 1 when a number of the half-wavelength resonators included in the resonator group of the first bandpass filter is 0 or an even number, or represents −1 when the number thereof is an odd number; "b" represents 1 when a number of the resonators coupled mainly inductively to their respective adjacent resonators is 0 or an even number, or represents −1 when the number thereof is an odd number; "c" represents 1 when coupling between the resonator of the input stage and the input terminal is based mainly on capacitive coupling, or represents −1 when the coupling is based mainly on inductive coupling; and "d" represents 1 when coupling between the resonator of the output stage and the output terminal is based mainly on capacitive coupling, or represents −1 when the coupling is based mainly on inductive coupling, where, in terms of passband characteristics of the first bandpass filter, "e" represents 1 when a number of attenuation poles resulting from a phase difference between signals to be transmitted over a plurality of paths, which are formed in a frequency region between the first frequency band and a third frequency band lying between the first frequency band and the second frequency band, is 0 or an even number, or represents −1 when the number thereof is an odd number, where, in the second bandpass filter, "f" represents 1 when a number of the half-wavelength resonators included in the resonator group of the second bandpass filter is 0 or an even number, or represents −1 when the number thereof is an odd number; "g" represents 1 when a number of the resonators coupled mainly inductively to their respective adjacent resonators is 0 or an even number, or represents −1 when the number thereof is an odd number; "h" represents 1 when coupling between the resonator of the input stage and the input terminal is based mainly on capacitive coupling, or represents −1 when the coupling is based mainly on inductive coupling; "j" represents 1 when coupling between the resonator of the output stage and the output terminal is based mainly on capacitive coupling, or represents −1 when the coupling is based mainly on inductive coupling; and "k" represents 1 when a number of the resonators included in the resonator group is an even number, or represents −1 when the number thereof is an odd number, and where, in terms of passband characteristics of the second bandpass filter, "m" represents 1 when a number of attenuation poles resulting from a phase difference between signals to be transmitted over a plurality of paths, which are formed in a frequency region between the third frequency band and the second frequency band, is 0 or an even number, or represents −1 when the number thereof is an odd number.

According to the filter circuit thus configured, in the third frequency band lying between the first frequency band which is the pass band of the first bandpass filter and the second frequency band which is the pass band of the second bandpass filter, a difference in phase takes place between an electric signal passing through the first bandpass filter and an electric signal passing through the second bandpass filter, thus causing mutual signal cancellation. This makes it possible to obtain a filter circuit that affords excellent passband characteristics in which an attenuation pole is formed between the two pass bands. Moreover, the filter circuit is a filter circuit having two pass bands comprising the first bandpass filter having the pass band of the first frequency band and the second bandpass filter having the pass band of the second frequency band which is higher in frequency than the first frequency band, the first bandpass filter and the second bandpass filter being connected in parallel with each other. Accordingly, it is possible to provide a filter circuit capable of arbitrarily setting frequencies for two pass bands.

The invention provides a wireless communication module, comprising:

an RF section including the filter circuit mentioned above; and a baseband section connected to the RF section.

The invention provides a wireless communication device, comprising:

the wireless communication module mentioned above; and an antenna connected to the RF section.

Advantageous Effects of Invention

According to the filter circuit of the invention, it is possible to obtain a filter circuit which is capable of arbitrarily setting frequencies for two pass bands and affords excellent passband characteristics in which an attenuation pole is formed between the two pass bands.

According to the wireless communication module and the wireless communication device of the invention, it is possible to perform wave filtering on signals lying in two communication bands with use of the filter circuit of the invention in which an adequate amount of attenuation is ensured in a frequency region between the two pass bands. Therefore, it is possible to obtain compact wireless communication module and wireless communication device that afford high-quality communication performance.

DESCRIPTION OF EMBODIMENTS

Hereinafter, a filter circuit according to the invention will be described in detail with reference to the accompanying drawings.

First Embodiment

Figure 1:
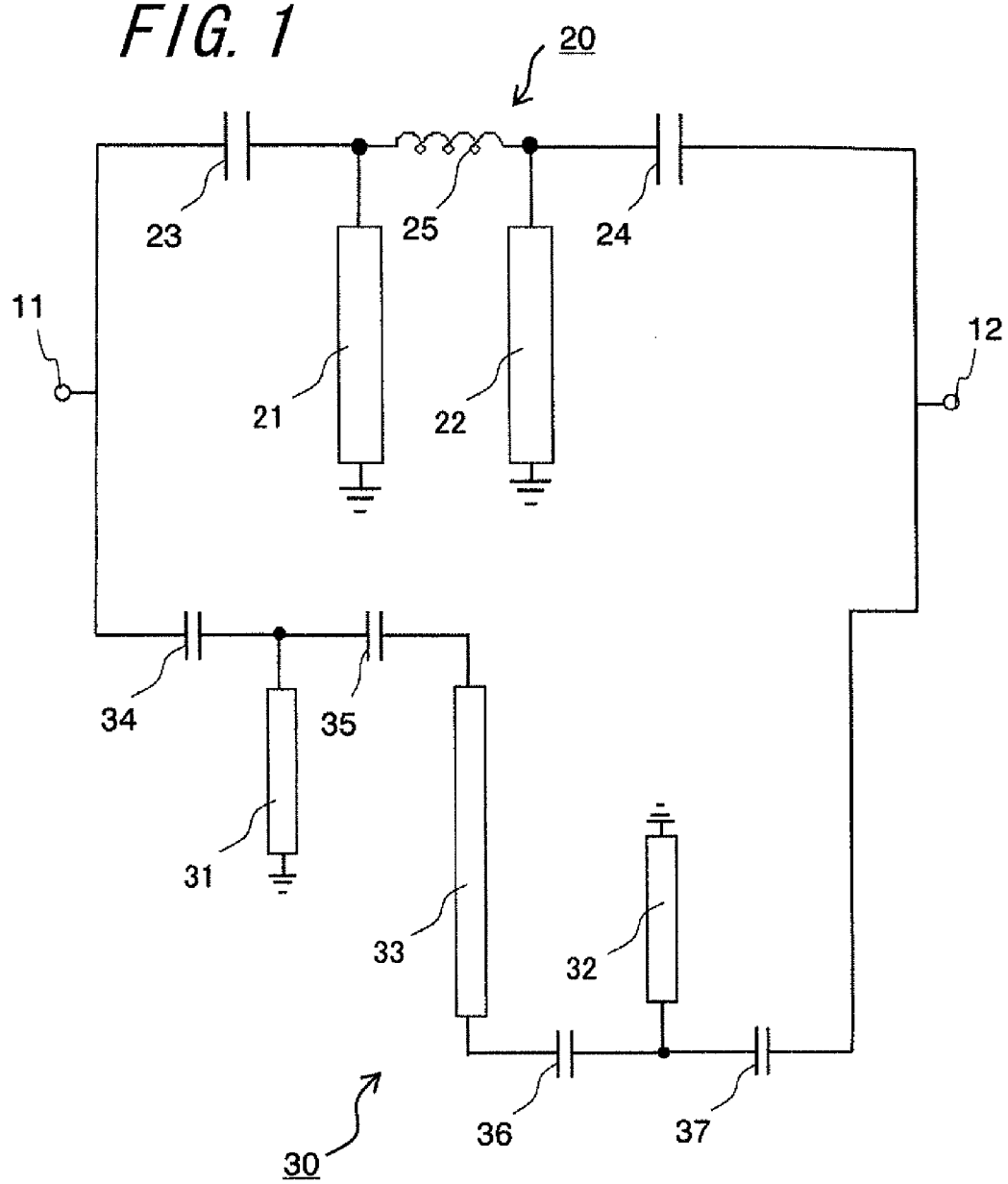
FIG. 1 is an equivalent circuit diagram showing a filter circuit in accordance with a first embodiment of the invention.
Figure 2:
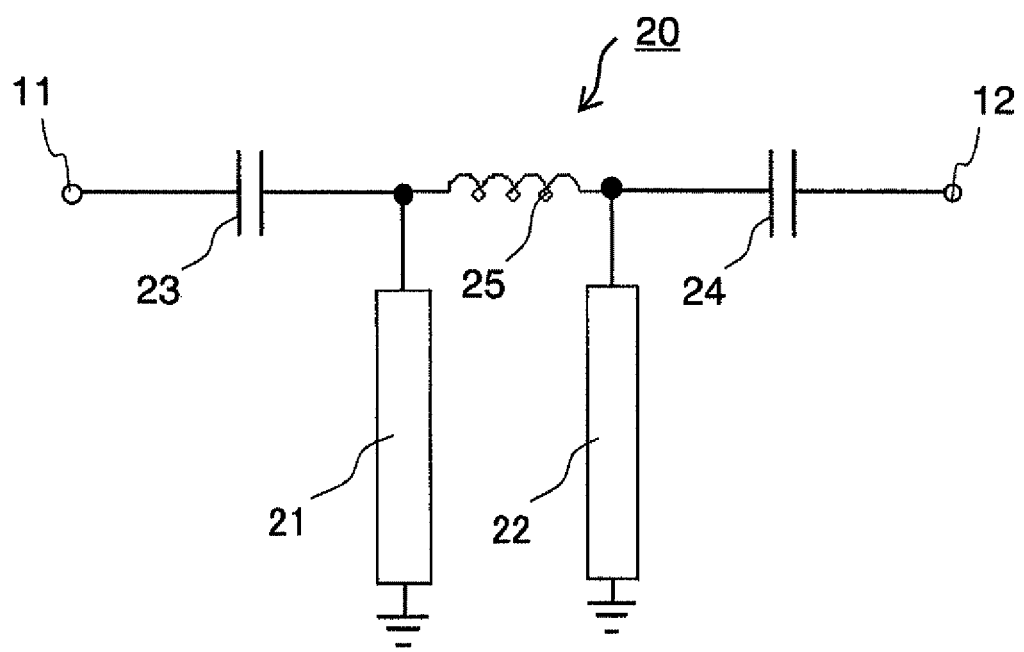
FIG. 2 is an equivalent circuit diagram showing a first bandpass filter 20 in FIG. 1.
Figure 3:
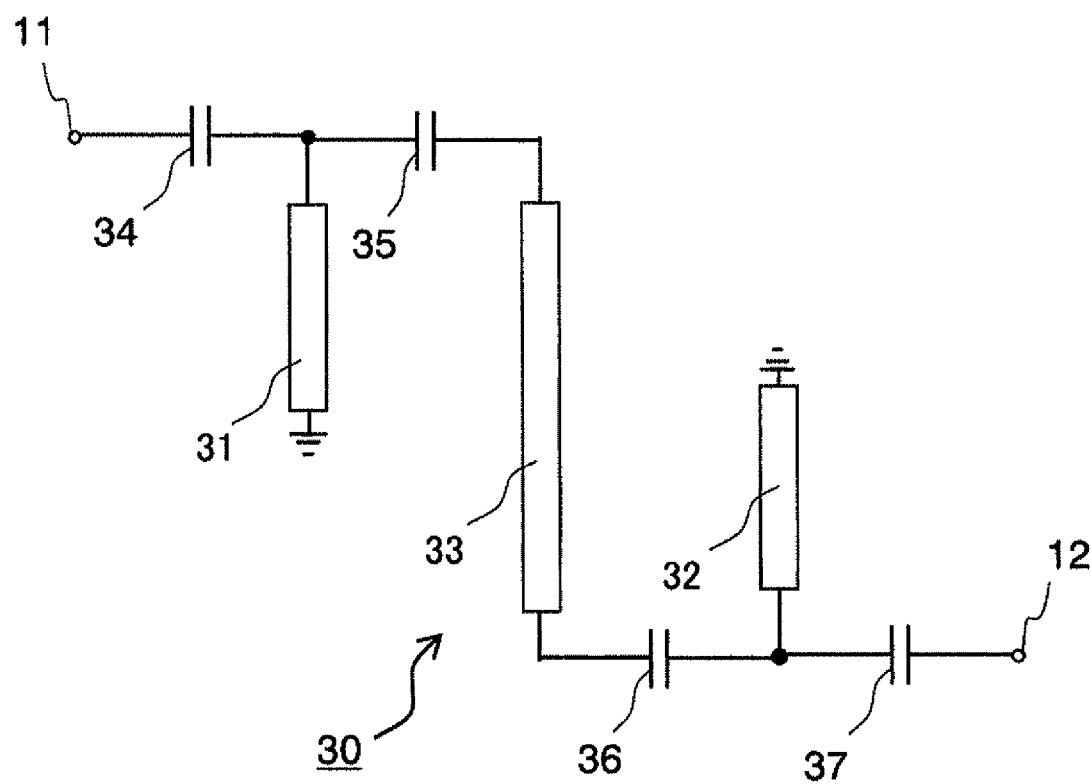
FIG. 3 is an equivalent circuit diagram showing a second bandpass filter 30 in FIG. 1.

FIG. 1 is an equivalent circuit diagram showing a filter circuit in accordance with a first embodiment of the invention. FIG. 2 is an equivalent circuit diagram showing a first bandpass filter 20 of the filter circuit in FIG. 1. FIG. 3 is an equivalent circuit diagram showing a second bandpass filter 30 of the filter circuit in FIG. 1.

As shown in FIG. 1, in the filter circuit of this embodiment, the first bandpass filter 20 and the second bandpass filter 30 are connected in parallel with each other between an input terminal 11 and an output terminal 12. The first bandpass filter 20 has a pass band of a first frequency band. The second bandpass filter 30 has a pass band of a second frequency band. The input terminal 11 and the output terminal 12 are made shareable between the first bandpass filter 20 and the second bandpass filter 30. According to the filter circuit of the present embodiment thereby configured, it is possible to achieve arbitrary setting of the first frequency band and the second frequency band, and thus obtain a filter circuit capable of arbitrarily setting frequencies for each of the two pass bands on an individual basis.

As shown in FIGS. 1 and 2, the first bandpass filter 20 comprises a resonator of the input stage 21 and a resonator on an output stage 22 that are each formed of a quarter-wavelength resonator which is grounded at one end. The two resonators 21 and 22 constitute a resonator group, thereby forming a pass band. Moreover, the resonator of the input stage 21 and the resonator of the output stage 22 are, at their other ends, coupled to each other through an inductor 25. Further, the other end of the resonator of the input stage 21 and the input terminal 11 are coupled to each other through a capacitor 23, and the other end of the resonator of the output stage 22 and the output terminal 12 are coupled to each other through a capacitor 24.

As shown in FIGS. 1 and 3, the second bandpass filter 30 comprises a resonator on an input stage 31, a resonator on an output stage 32, and a resonator 33. The resonator of the input stage 31 and the resonator of the output stage 32 are each formed of a quarter-wavelength resonator which is grounded at one end. The resonator 33 is formed of a half-wavelength resonator which is opened at both ends, and is placed between the resonator of the input stage 31 and the resonator of the output stage 32. The three resonators 31 to 33 constitute a resonator group, thereby forming a pass band. Moreover, the other end of the resonator of the input stage 31 and one end of the resonator 33 are coupled to each other through a capacitor 35, and the other end of the resonator 33 and the other end of the resonator of the output stage 32 are coupled to each other through a capacitor 36. Further, the other end of the resonator of the input stage 31 and the input terminal 11 are coupled to each other through a capacitor 34, and the other end of the resonator of the output stage 32 and the output terminal 12 are coupled to each other through a capacitor 37.

Figure 4:
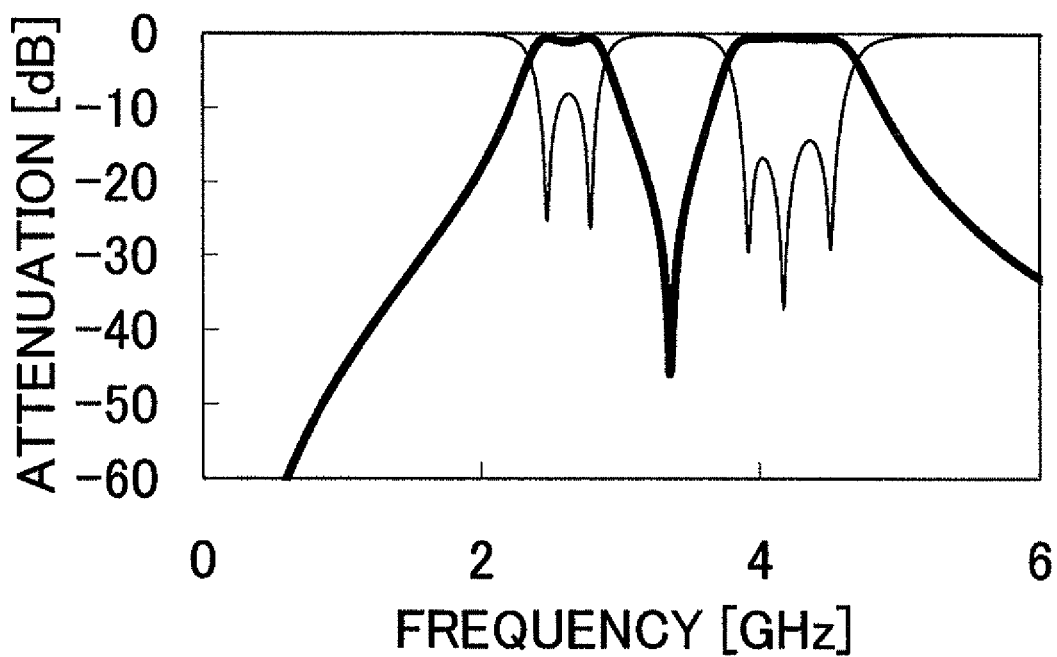
FIG. 4 is a diagram showing a result of simulation as to electrical characteristics of the circuit shown in FIG. 1.
Figure 5:
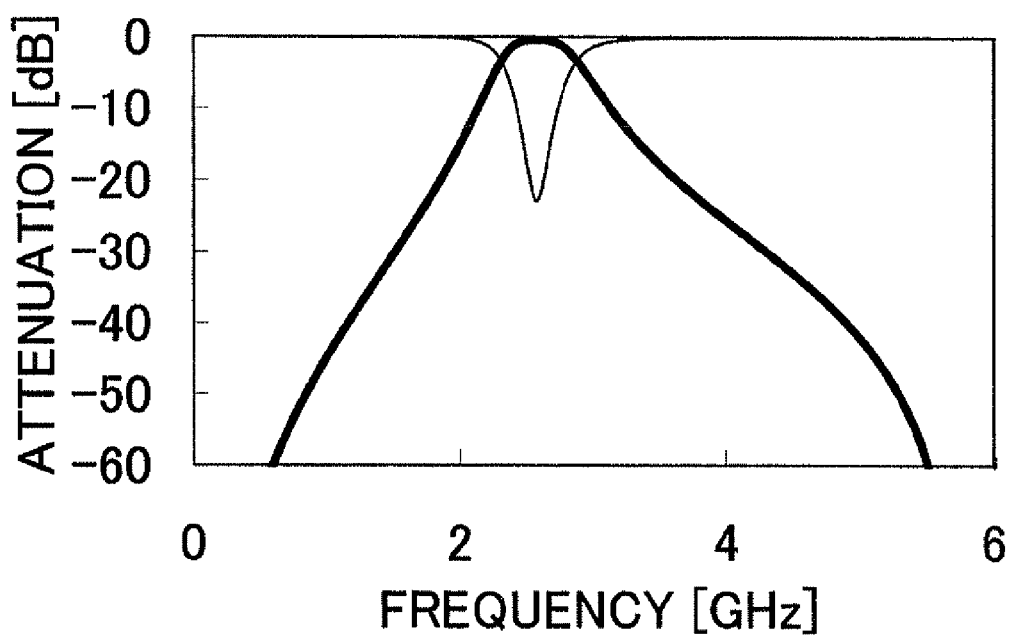
FIG. 5 is a diagram showing a result of simulation as to electrical characteristics of the circuit shown in FIG. 2.
Figure 6:
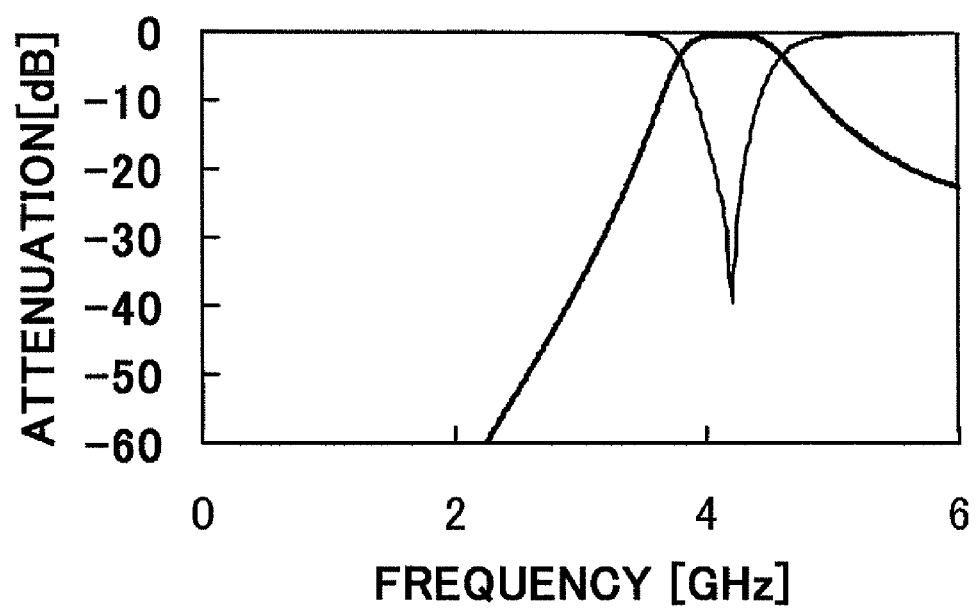
FIG. 6 is a diagram showing a result of simulation as to electrical characteristics of the circuit shown in FIG. 3.
Figure 7:
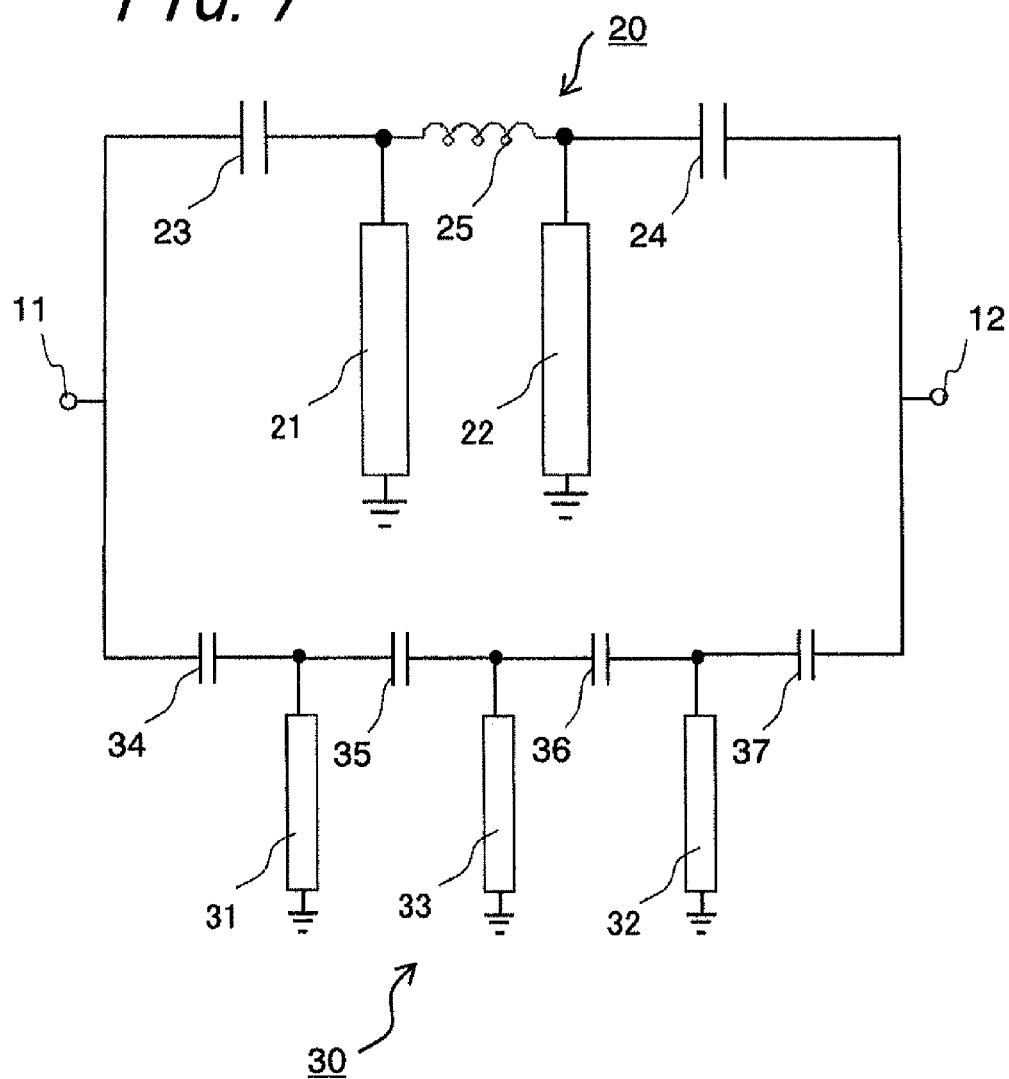
FIG. 7 is an equivalent circuit diagram showing a filter circuit of a comparative example.
Figure 8:
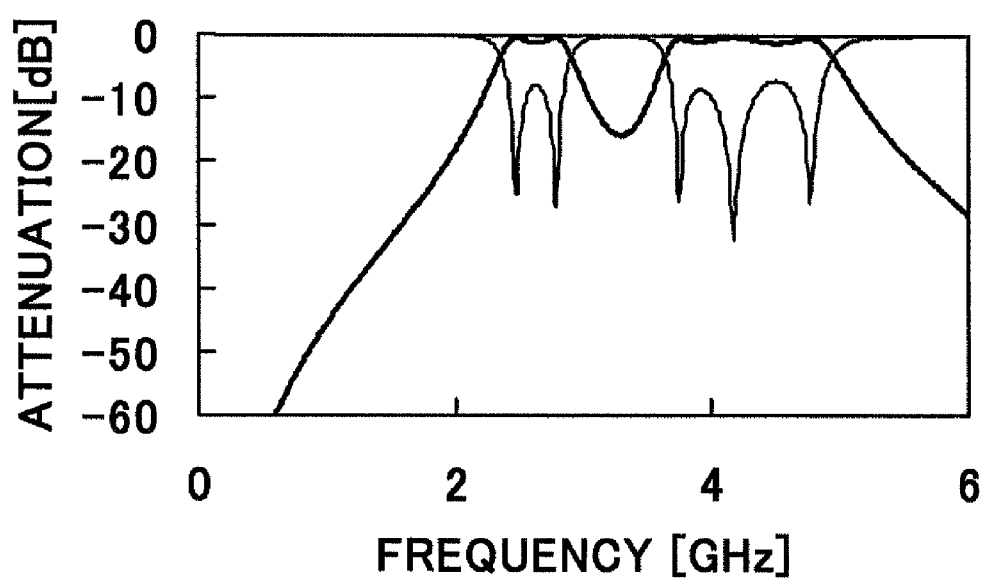
FIG. 8 is a diagram showing a result of simulation as to electrical characteristics of the circuit shown in FIG. 7.

In FIG. 4, there is shown a result of simulation as to electrical characteristics of the filter circuit of the embodiment shown in FIG. 1. In FIG. 5, there is shown a result of simulation as to electrical characteristics of the first bandpass filter 20 shown in FIG. 2. In FIG. 6, there is shown a result of simulation as to electrical characteristics of the second bandpass filter 30 shown in FIG. 3. Moreover, in FIG. 7, there is shown a filter circuit of a comparative example in which the half-wavelength resonator 33 of the second bandpass filter 30 of the filter circuit of the embodiment shown in FIG. 1 is replaced with a quarter-wavelength resonator. The result of simulation as to electrical characteristics of the comparative example is shown in FIG. 8. In the graphs shown in FIGS. 4 to 6 and 8, an abscissa axis represents frequency and an ordinate axis represents attenuation. Moreover, in each of the graphs, a thick solid line indicates passband characteristics (S21), whereas a thin solid line indicates reflection characteristics (S11), the characteristics being observed under the condition where the input terminal 11 is defined as a port 1 and the output terminal 12 is defined as a port 2.

The simulation has been conducted on the circuit shown in FIGS. 1 to 3 under the assumption that: the resonators 21 and 22, as well the resonators 31 to 33, are each of a 0.2 mm-wide strip line disposed inside a dielectric body which is 18.7 in relative permittivity and 1 mm in thickness, and on upper and lower surfaces of which ground conductors are disposed; the resonators 21 and 22 are 6 mm in length; the resonators 31 and 32 are 3 mm in length; the resonator 33 is 7.42 mm in length; the inductor 25 stands at 15 nH; the capacitors 23 and 24 stand at 0.65 pF; the capacitors 34 and 37 stand at 0.5 pF; and the capacitors 35 and 36 stand at 0.19 pF. Where the circuit shown in FIG. 7 is concerned, the same component values as those set for the circuit shown in FIG. 1 were adopted, except that the resonator 33 has a length of 3.3 mm.

According to the result of the simulation, in terms of passband characteristics of the first bandpass filter 20 and passband characteristics of the second bandpass filter 30 as shown in FIGS. 5 and 6, no attenuation pole is observed. On the other hand, in terms of passband characteristics of the filter circuit of the embodiment as shown in FIG. 4, an attenuation pole was formed between the two pass bands. It will thus be seen that the filter circuit affords excellent passband characteristics in which an adequate amount of attenuation is ensured in a frequency region between the two pass bands. It can be considered that the attenuation pole arises for the following reason. That is, in the frequency region between the two pass bands, the difference in phase between an electric signal passing through the first bandpass filter 20 and an electric signal passing through the second bandpass filter 30 approaches 180°, with the consequence that the electric signal passing through the first bandpass filter 20 and the electric signal passing through the second bandpass filter 30 cancel each other out.

Moreover, in terms of passband characteristics of the filter circuit of the comparative example as shown in FIG. 8, no attenuation pole was formed between the two pass bands. As will be understood from the comparison between the circuit shown in FIG. 1 and the circuit shown in FIG. 7, change of the resonator 33 of the second bandpass filter 30 from a half-wavelength resonator to a quarter-wavelength resonator makes it possible to achieve phase changes in electric signals passing through the second bandpass filter 30 in the frequency region between the two pass bands, and thereby cause the electric signal passing through the first bandpass filter 20 and the electric signal passing through the second bandpass filter 30 to cancel each other out, whereby an attenuation pole can be formed.

The inventors concerned have conducted extensive studies in order to seek requirements under which mutual cancellation of the electric signal passing through the first bandpass filter 20 and the electric signal passing through the second bandpass filter 30 takes place when a part of resonators constituting the first bandpass filter 20 and the second bandpass filter 30 is changed from a quarter-wavelength resonator to a half-wavelength resonator.

To begin with, in order to check variations in phase of electric signals passing through a bandpass filter in a frequency region outside the pass band, examination has been made on a bandpass filter comprising at least: a resonator group comprising a plurality of resonators arranged in orderly sequence so as to be coupled to each other to form a pass band; an input terminal coupled to a resonator on an input stage; and an output terminal coupled to a resonator on an output stage, wherein the resonator group is composed of at least one of one or more quarter-wavelength resonators which are short-circuited at one end and one or more half-wavelength resonators which are opened at both ends, and the respective half-wavelength resonators have one end coupled to an adjacent resonator at the input terminal side or to the input terminal and has other end coupled to an adjacent resonator at the output terminal side or to the output terminal. As the result of the examination, it has been concluded as follows.

1. Phase reversal takes place in a frequency region outside the pass band every time the number of half-wavelength resonators included in the resonator group changes on a one-by-one basis.

2. Phase reversal takes place in a frequency region outside the pass band every time the number of resonators coupled mainly inductively to their respective adjacent resonators in the resonator group changes on a one-by-one basis.

3. Phase reversal takes place in a frequency region outside the pass band depending on whether coupling between the input terminal and the resonator of the input stage is based mainly on capacitive coupling or based mainly on inductive coupling.

4. Phase reversal takes place in a frequency region outside the pass band depending on whether coupling between the output terminal and the resonator of the output stage is based mainly on capacitive coupling or based mainly on inductive coupling.

5. Phase reversal takes place in a region of lower frequencies relative to the pass band every time the number of resonators constituting the resonator group changes on a one-by-one basis.

6. In terms of passband characteristics of the bandpass filter, where an attenuation pole resulting from a phase difference between signals to be transmitted over a plurality of paths, is formed in a frequency region outside the pass band, phase reversal takes place on both sides of the attenuation pole.

7. In the resonator group, the number of resonators coupled mainly capacitively to their respective adjacent resonators has no influence on a phase in a frequency region outside the pass band. Also, the number of resonators constituting the resonator group has no influence on a phase in a region of higher frequencies relative to the pass band.

On the basis of the above result, in regard to the filter circuit having two pass bands comprising the first bandpass filter having the first frequency band as a pass band and the second bandpass filter having the second frequency band which is higher in frequency than the first frequency band, as a pass band, the first bandpass filter and the second bandpass filter being connected in parallel with each other, studies have been conducted to seek requirements under which an electric signal passing through the first bandpass filter and an electric signal passing through the second bandpass filter are caused to cancel each other out so that an attenuation pole can be formed in a third frequency band lying between the first frequency band and the second frequency band. The following is the result of the studies.

That is, it has been found that the number of half-wavelength resonators included in the resonator group of the first bandpass filter and the number of half-wavelength resonators included in the resonator group of the second bandpass filter should preferably be determined so as to fulfill a condition given in an equation form as: $a \times b \times c \times d \times e \times f \times g \times h \times j \times k \times m = -1$, where, in the first bandpass filter, "a" represents 1 when a number of half-wavelength resonators included in the resonator group is 0 or an even number, or represents −1 when the number thereof is an odd number; "b" represents 1 when a number of pairs of adjacent resonators coupled mainly inductively each other to their respective adjacent resonators is 0 or an even number, or represents −1 when the number thereof is an odd number; "c" represents 1 when coupling between the resonator of the input stage and the input terminal is based mainly on capacitive coupling, or represents −1 when the coupling is based mainly on inductive coupling; and "d" represents 1 when coupling between the resonator of the output stage and the output terminal is based mainly on capacitive coupling, or represents −1 when the coupling is based mainly on inductive coupling, where, in terms of passband characteristics of the first bandpass filter, "e" represents 1 when a number of attenuation poles resulting from a phase difference between signals to be transmitted over a plurality of paths, which are formed in a frequency region between the first frequency band and the third frequency band lying between the first frequency band and the second frequency band, is 0 or an even number, or represents −1 when the number thereof is an odd number, where, in the second bandpass filter, "f" represents 1 when a number of half-wavelength resonators included in the resonator group is 0 or an even number, or represents −1 when the number thereof is an odd number; "g" represents 1 when a number of pairs of adjacent resonators coupled mainly inductively each other to their respective adjacent resonators is 0 or an even number, or represents −1 when the number thereof is an odd number; "h" represents 1 when coupling between the resonator of the input stage and the input terminal is based mainly on capacitive coupling, or represents −1 when the coupling is based mainly on inductive coupling; "j" represents 1 when coupling between the resonator of the output stage and the output terminal is based mainly on capacitive coupling, or represents −1 when the coupling is based mainly on inductive coupling; and "k" represents 1 when a number of resonators constituting the resonator group is an even number, or represents −1 when the number thereof is an odd number, and where, in terms of passband characteristics of the second bandpass filter, "m" represents 1 when a number of attenuation poles resulting from a phase difference between signals to be transmitted over a plurality of paths, which are formed in a frequency region between the third frequency band and the second frequency band, is 0 or an even number, or represents −1 when the number thereof is an odd number.

For example, with respect to the filter circuit of the embodiment shown in FIG. 1, in the first bandpass filter 20, the number of half-wavelength resonators included in the resonator group is 0, and the number of resonators coupled mainly inductively to their respective adjacent resonators in the resonator group is 1. Moreover, coupling between the input terminal 11 and the resonator of the input stage 21 and coupling between the output terminal 12 and the resonator of the output stage 22 are each based on capacitive coupling. Further, in terms of passband characteristics of the first bandpass filter 20 as shown in FIG. 5, an attenuation pole resulting from a phase difference between signals to be transmitted over a plurality of paths is not formed.

Further, in the second bandpass filter 30, the number of half-wavelength resonators included in the resonator group is 1, and the number of resonators coupled mainly inductively to their respective adjacent resonators in the resonator group is 0. Moreover, coupling between the input terminal 11 and the resonator of the input stage 31 and coupling between the output terminal 12 and the resonator of the output stage 32 are each based on capacitive coupling, and the number of resonators constituting the resonator group is 3. Further, in terms of passband characteristics of the second bandpass filter 30 as shown in FIG. 6, an attenuation pole resulting from a phase difference between signals to be transmitted over a plurality of paths is not formed.

Accordingly, in the filter circuit of the embodiment, since $b=f=k=-1$, and $a=c=d=e=g=h=j=m=1$, it follows that the relationship $a \times b \times c \times d \times e \times f \times g \times h \times j \times k \times m = -1$ holds. Hence, according to the filter circuit of the embodiment, an electric signal passing through the first bandpass filter 20 and an electric signal passing through the second bandpass filter 30 cancel each other out in a frequency region between the two pass band, thereby forming an attenuation pole. This makes it possible to obtain excellent passband characteristics in which an adequate amount of attenuation is ensured in the frequency region between the two pass band.

Moreover, according to the filter circuit of the embodiment, in one of the two bandpass filters, the resonator group is formed solely of quarter-wavelength resonators, whereas in the other, the resonator group is formed of quarter-wavelength resonators and a single half-wavelength resonator. This makes it possible to attain excellent passband characteristics in which an attenuation pole exists in a frequency region between the two pass bands, as well as to provide a compact filter circuit.

Second Embodiment

Figure 9:
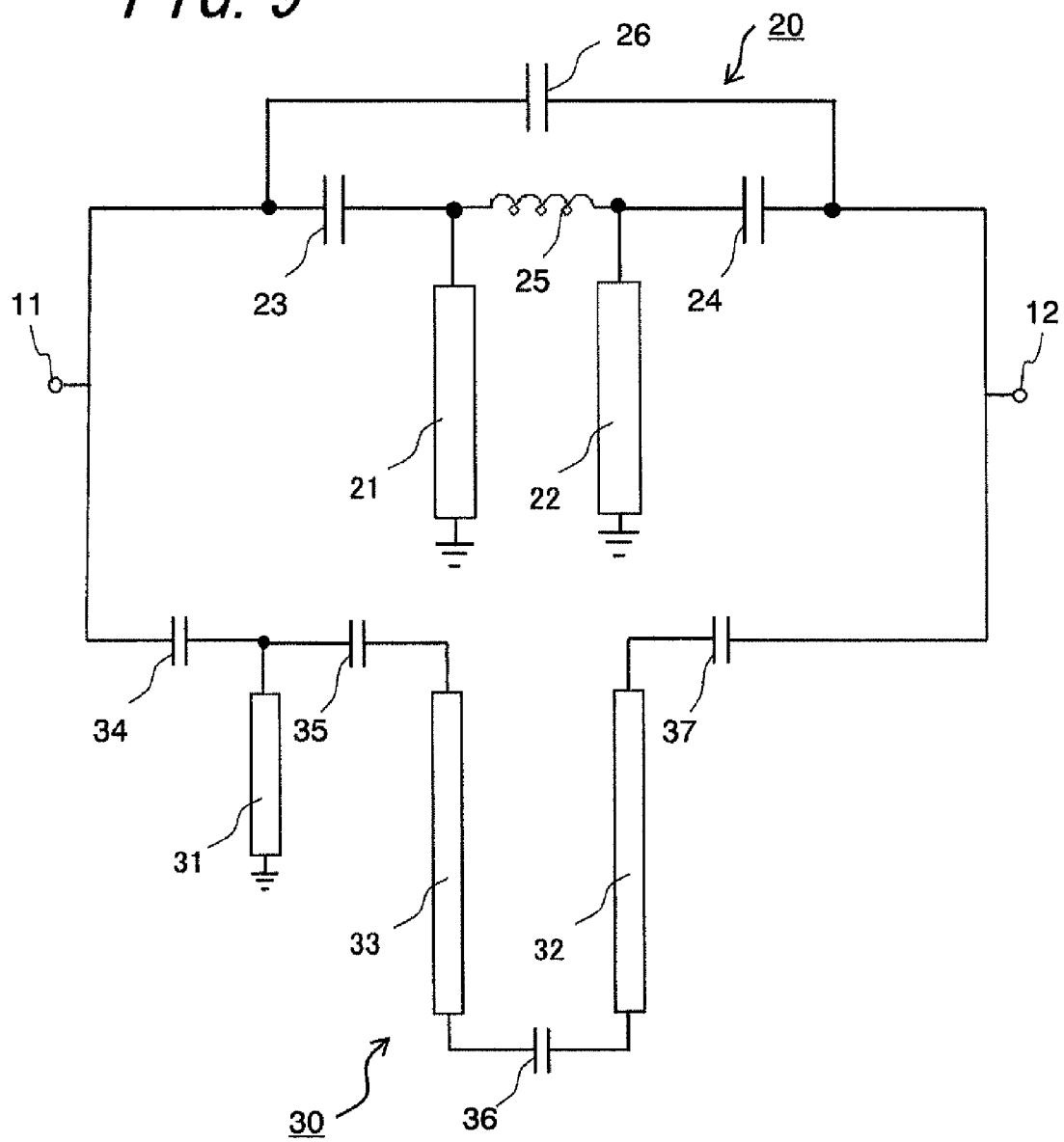
FIG. 9 is an equivalent circuit diagram showing a filter circuit in accordance with a second embodiment of the invention.
Figure 10:
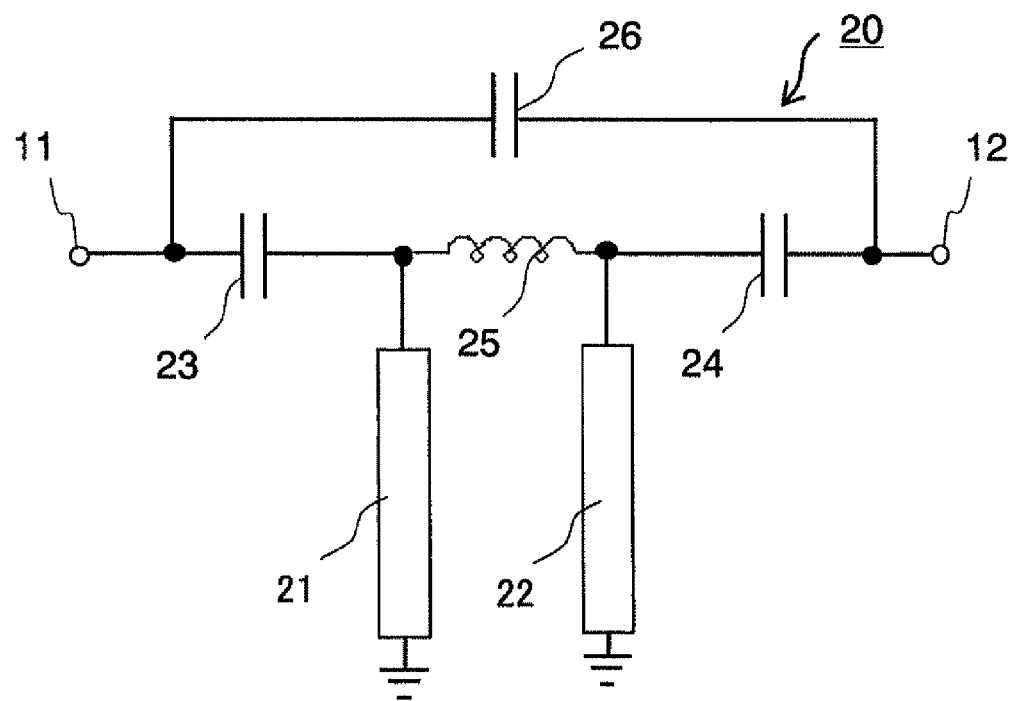
FIG. 10 is an equivalent circuit diagram showing a first bandpass filter 20 in FIG. 9.
Figure 11:
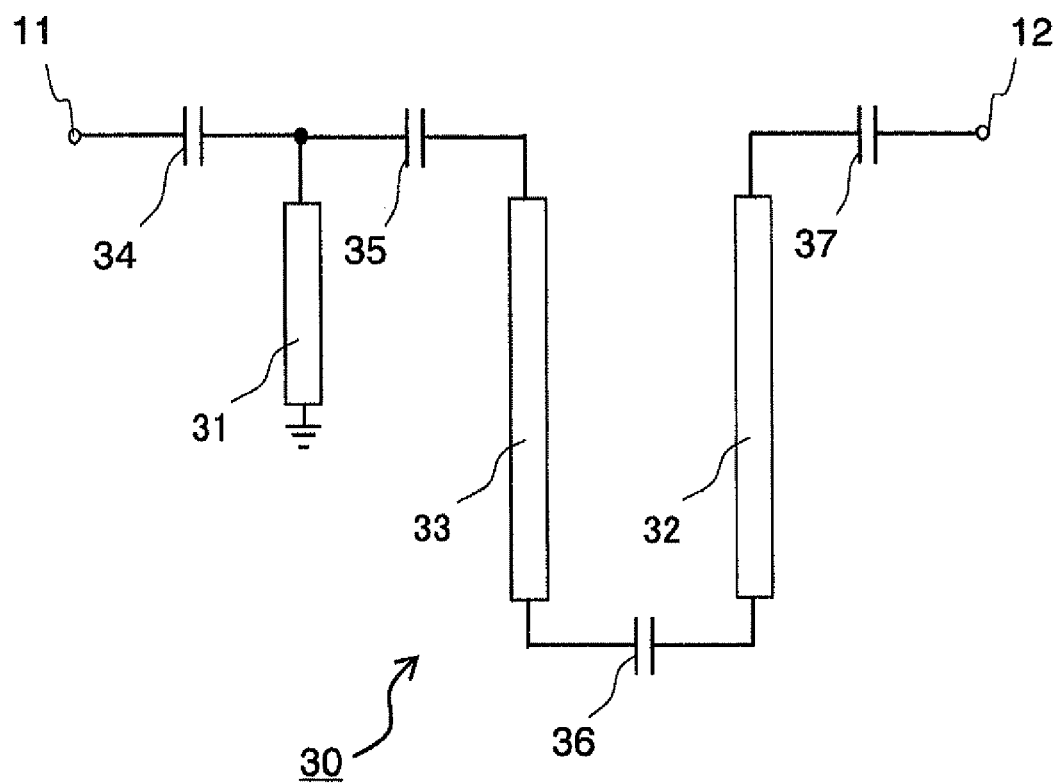
FIG. 11 is an equivalent circuit diagram showing a second bandpass filter 30 in FIG. 9 and FIG. 15.

FIG. 9 is an equivalent circuit diagram showing a filter circuit in accordance with a second embodiment of the invention. FIG. 10 is an equivalent circuit diagram showing a first bandpass filter 20 of the filter circuit in FIG. 9. FIG. 11 is an equivalent circuit diagram showing a second bandpass filter 30 of the filter circuit in FIG. 9.

As shown in FIG. 9, in the filter circuit of this embodiment, the first bandpass filter 20 and the second bandpass filter 30 are connected in parallel with each other between an input terminal 11 and an output terminal 12. The first bandpass filter 20 has a pass band of a first frequency band. The second bandpass filter 30 has a pass band of a second frequency band. The input terminal 11 and the output terminal 12 are made shareable between the first bandpass filter 20 and the second bandpass filter 30.

As shown in FIGS. 9 and 10, the first bandpass filter 20 comprises a resonator on an input stage 21 and a resonator on an output stage 22 that are each formed of a quarter-wavelength resonator which is grounded at one end. The two resonators 21 and 22 constitute a resonator group, thereby forming a pass band. Moreover, the resonator of the input stage 21 and the resonator of the output stage 22 are, at their other ends, coupled to each other through an inductor 25. Further, the other end of the resonator of the input stage 21 and the input terminal 11 are coupled to each other through a capacitor 23, and the other end of the resonator of the output stage 22 and the output terminal 12 are coupled to each other through a capacitor 24.

Moreover, in the first bandpass filter 20 of the filter circuit of the present embodiment, the input terminal 11 and the output terminal 12 are connected to each other through a capacitor 26. In the first bandpass filter 20, the capacitor 26 is provided for the sake of causing a phase difference of about 180° between an electric signal which is transmitted over a path passing through the input terminal 11, the capacitor 23, the inductor 25, the capacitor 24, and the output terminal 12 in that order and an electric signal which is transmitted over a path passing through the input terminal 11, the capacitor 26 and the output terminal 12 in that order, so that the signals cancel each other out. In this way, in terms of passband characteristics of the first bandpass filter 20, attenuation poles can be formed on both sides of the pass band.

As shown in FIGS. 9 and 11, the second bandpass filter 30 comprises a resonator on an input stage 31, a resonator on an output stage 32, and a resonator 33. The resonator of the input stage 31 is formed of a quarter-wavelength resonator which is grounded at one end. The resonator of the output stage 32 is formed of a half-wavelength resonator which is opened at both ends. The resonator 33 is formed of a half-wavelength resonator which is opened at both ends, and is placed between the resonator of the input stage 31 and the resonator of the output stage 32. The three resonators 31 to 33 constitute a resonator group, thereby forming a pass band. Moreover, the other end of the resonator of the input stage 31 and one end of the resonator 33 are coupled to each other through a capacitor 35, and the other end of the resonator 33 and the other end of the resonator of the output stage 32 are coupled to each other through a capacitor 36. Further, the input terminal 11 and the other end of the resonator of the input stage 31 are coupled to each other through a capacitor 34, and the other end of the resonator of the output stage 32 and the output terminal 12 are coupled to each other through a capacitor 37.

Figure 12:
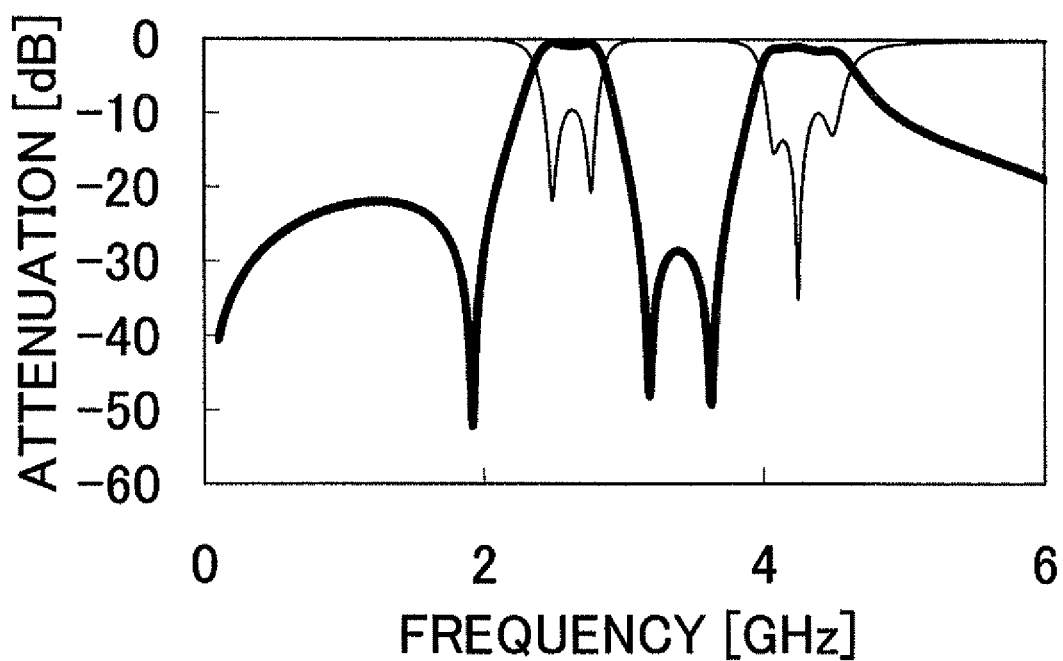
FIG. 12 is a diagram showing a result of simulation as to electrical characteristics of the circuit shown in FIG. 9.
Figure 13:
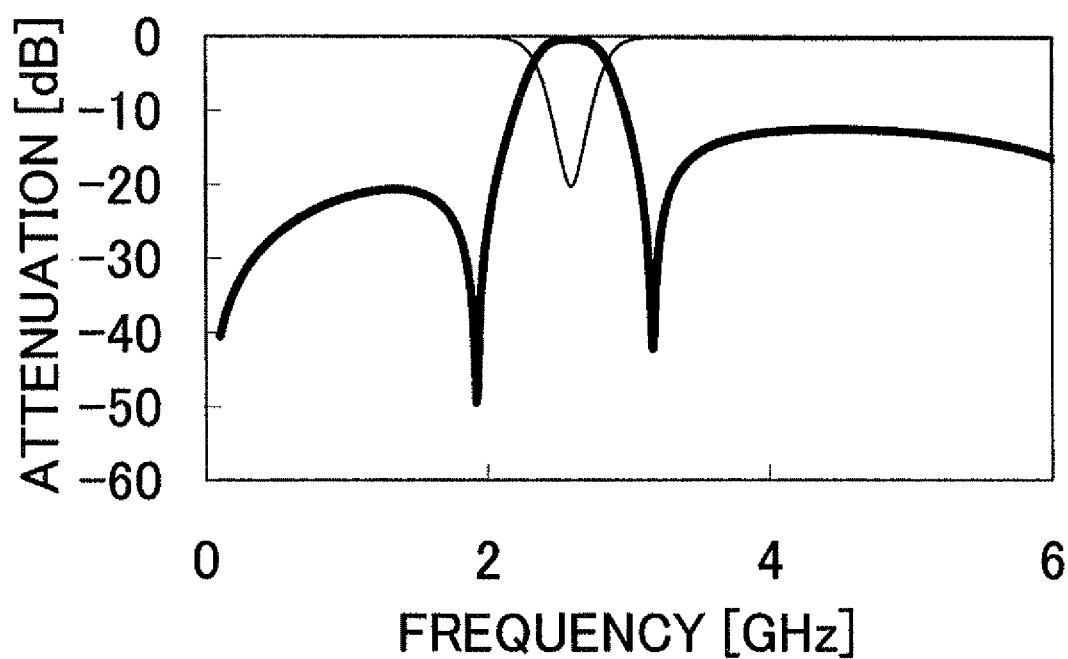
FIG. 13 is a diagram showing a result of simulation as to electrical characteristics of the circuit shown in FIG. 10.
Figure 14:
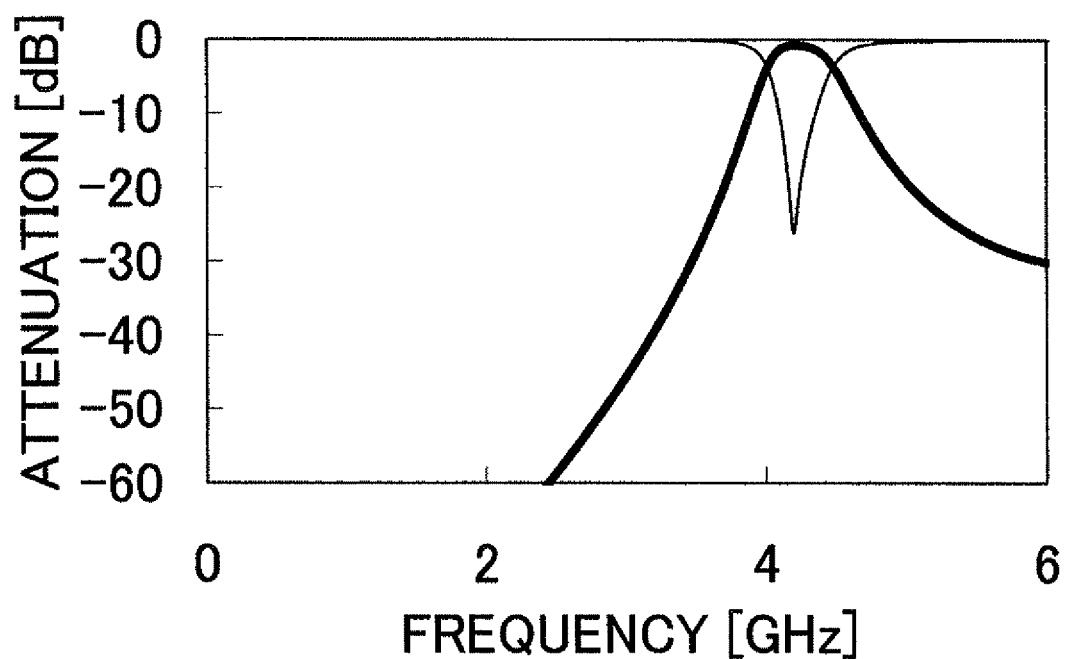
FIG. 14 is a diagram showing a result of simulation as to electrical characteristics of the circuit shown in FIG. 11.

In FIG. 12, there is shown a result of simulation as to electrical characteristics of the filter circuit of the embodiment shown in FIG. 9. In FIG. 13, there is shown a result of simulation as to electrical characteristics of the first bandpass filter 20 shown in FIG. 10. In FIG. 14, there is shown a result of simulation as to electrical characteristics of the second bandpass filter 30 shown in FIG. 11. In the graphs shown in FIGS. 12 to 14, an abscissa axis represents frequency and an ordinate axis represents attenuation. Moreover, in each of the graphs, a thick solid line indicates passband characteristics (S21), whereas a thin solid line indicates reflection characteristics (S11), the characteristics being observed under the condition where the input terminal 11 is defined as a port 1 and the output terminal 12 is defined as a port 2.

The simulation has been conducted on the circuit shown in FIGS. 9 to 11 under the assumption that: the resonators 21 and 22, as well the resonators 31 to 33, are each of a 0.2 mm-wide strip line disposed inside a dielectric body which is 18.7 in relative permittivity and 1 mm in thickness, and on upper and lower surfaces of which ground conductors are disposed; the resonators 21 and 22 are 6 mm in length; the resonator 31 is 3 mm in length; the resonator 32 is 7.54 mm in length; the resonator 33 is 7.0 mm in length; the inductor 25 stands at 15 nH; the capacitors 23 and 24 stand at 0.65 pF; the capacitor 26 stands at 0.15 pF; the capacitors 34 and 37 stand at 0.5 pF; and the capacitors 35 and 36 stand at 0.14 pF.

According to the result of the simulation, in terms of passband characteristics of the first bandpass filter 20 as shown in FIG. 13, attenuation poles resulting from a phase difference between electric signals to be transmitted over two paths, are formed on a region of higher frequencies and a region of lower frequencies in the vicinity of the pass band. On the other hand, in terms of passband characteristics of the second bandpass filter 30 as shown in FIG. 14, no attenuation pole is observed. Moreover, in terms of passband characteristics of the filter circuit of the embodiment as shown in FIG. 12, an additional attenuation pole is formed in a frequency region between the attenuation pole in the higher-frequency region in the vicinity of the pass band of the first bandpass filter 20 and the pass band of the second bandpass filter 30.

Note that, in the filter circuit of the embodiment, since $b=e=k=-1$, and $a=c=d=f=g=h=j=m=1$, it follows that the relationship $a \times b \times c \times d \times e \times f \times g \times h \times j \times k \times m = -1$ holds. Hence, according to the filter circuit of the embodiment, an electric signal passing through the first bandpass filter 20 and an electric signal passing through the second bandpass filter 30 cancel each other out in a frequency region between the two pass band, thereby forming an attenuation pole. This makes it possible to obtain excellent passband characteristics in which an adequate amount of attenuation is ensured in the frequency region between the two pass band.

Third Embodiment

Figure 15:
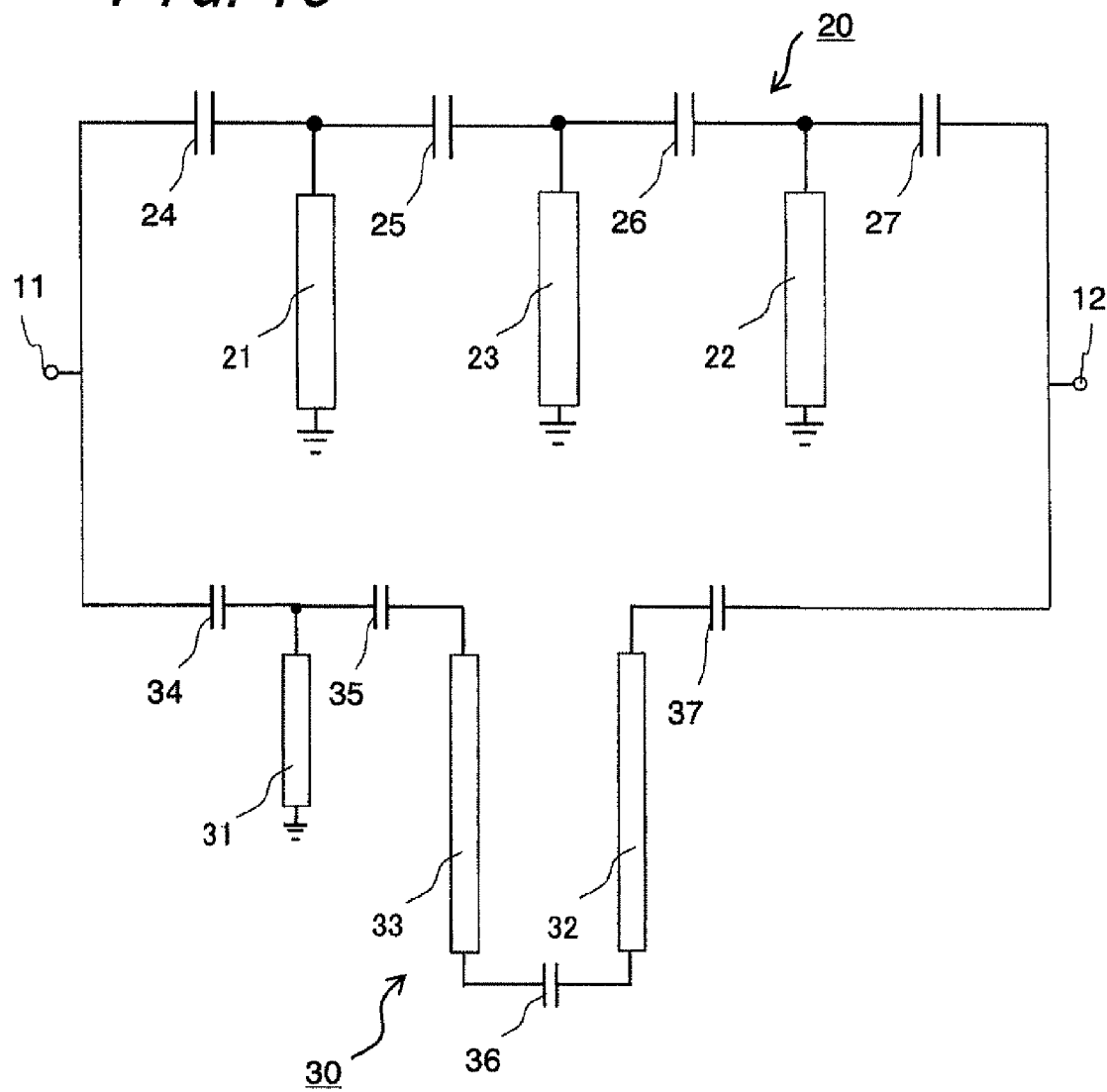
FIG. 15 is an equivalent circuit diagram showing a filter circuit in accordance with a third embodiment of the invention.
Figure 16:
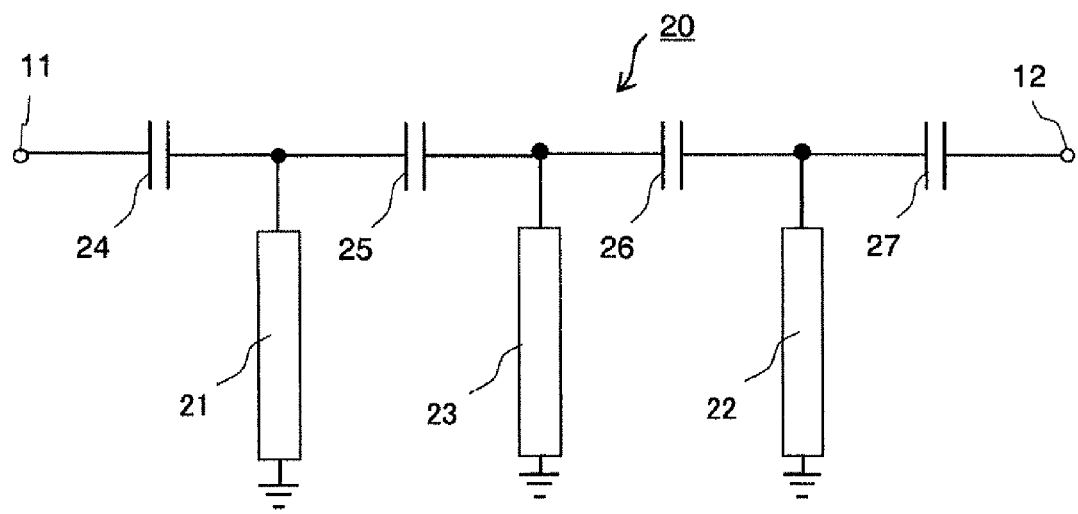
FIG. 16 is an equivalent circuit diagram showing a first bandpass filter 20 in FIG. 15.

FIG. 15 is an equivalent circuit diagram showing a filter circuit in accordance with a third embodiment of the invention. FIG. 16 is an equivalent circuit diagram showing a first bandpass filter 20 of the filter circuit in FIG. 15. It is noted that a second bandpass filter 30 of the filter circuit of this embodiment is identical with the second bandpass filter 30 of the above-mentioned second embodiment shown in FIG. 11 in all respects including component values, and the electrical characteristics thereof are such as shown in FIG. 14.

As shown in FIG. 15, in the filter circuit of this embodiment, the first bandpass filter 20 and the second bandpass filter 30 are connected in parallel with each other between an input terminal 11 and an output terminal 12. The first bandpass filter 20 has a passband of a first frequency band. The second bandpass filter 30 has a passband of a second frequency band. The input terminal 11 and the output terminal 12 are made shareable between the first bandpass filter 20 and the second bandpass filter 30.

As shown in FIGS. 15 and 16, the first bandpass filter 20 comprises a resonator on an input stage 21, a resonator on an output stage 22, and a resonator 23 that are each formed of a quarter-wavelength resonator which is grounded at one end. The resonator 23 is situated between the resonator of the input stage 21 and the resonator of the output stage 22. The three resonators 21 to 23 constitute a resonator group, thereby forming a pass band. Moreover, the resonator of the input stage 21 and the resonator 23 are, at their other ends, coupled to each other through a capacitor 25, and the resonator 23 and the resonator of the output stage 22 are, at their other ends, coupled to each other through a capacitor 26. Further, the other end of the resonator of the input stage 21 and the input terminal 11 are coupled to each other through a capacitor 24, and the other end of the resonator of the output stage 22 and the output terminal 12 are coupled to each other through a capacitor 27.

Figure 17:
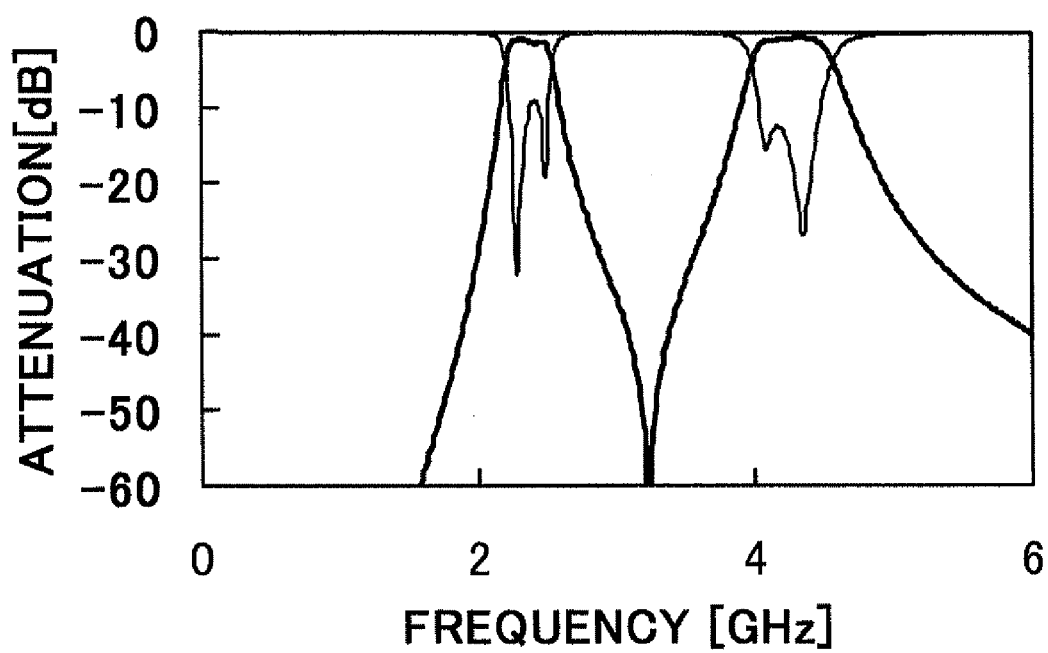
FIG. 17 is a diagram showing a result of simulation as to electrical characteristics of the circuit shown in FIG. 15.
Figure 18:
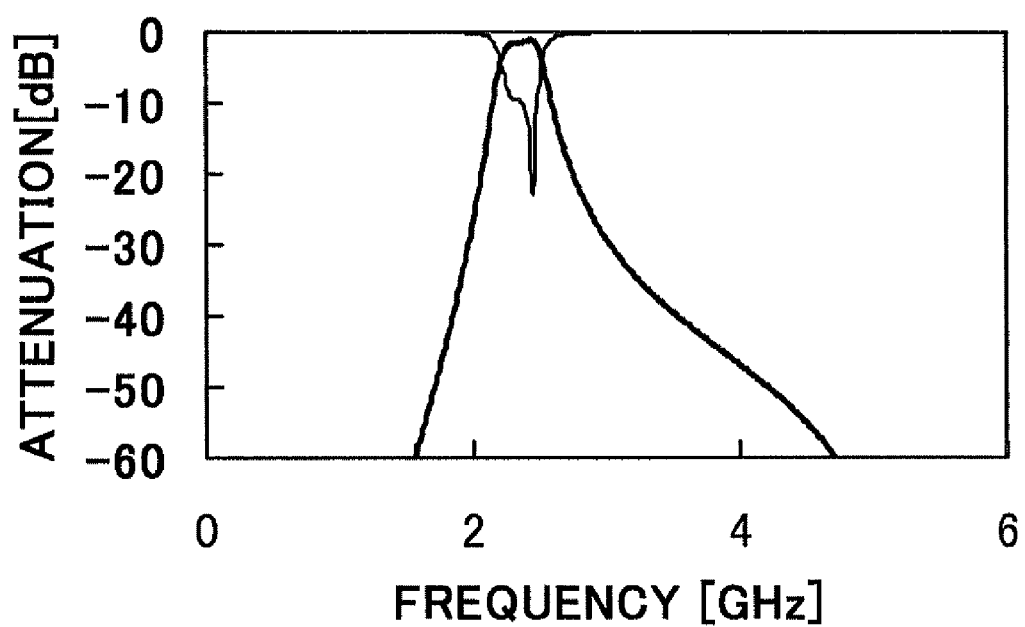
FIG. 18 is a diagram showing a result of simulation as to electrical characteristics of the circuit shown in FIG. 16.

In FIG. 17, there is shown a result of simulation as to electrical characteristics of the filter circuit of the embodiment shown in FIG. 15. In FIG. 18, there is shown a result of simulation as to electrical characteristics of the first bandpass filter 20 shown in FIG. 16. In the graphs shown in FIGS. 17 and 18, an abscissa axis represents frequency and an ordinate axis represents attenuation. Moreover, in each of the graphs, a thick solid line indicates passband characteristics (S21), whereas a thin solid line indicates reflection characteristics (S11), the characteristics being observed under the condition where the input terminal 11 is defined as a port 1 and the output terminal 12 is defined as a port 2.

The simulation has been conducted on the circuit shown in FIGS. 15 and 16 under the assumption that: the resonators 21 to 23 are each of a 0.2 mm-wide, 6 mm-long strip line disposed inside a dielectric body which is 18.7 in relative permittivity and 1 mm in thickness, and on upper and lower surfaces of which ground conductors are disposed; the capacitors 24 and 27 stand at 0.6 pF; and the capacitors 25 and 26 stand at 0.15 pF.

According to the result of the simulation, in terms of passband characteristics of the first bandpass filter 20 as shown in FIG. 18, as well as passband characteristics of the second bandpass filter 30 as shown in FIG. 14, no attenuation pole is observed. Moreover, in terms of passband characteristics of the filter circuit of the embodiment as shown in FIG. 17, a single attenuation pole is formed in a frequency region between the pass band of the first bandpass filter 20 and the pass band of the second bandpass filter 30.

Note that in the filter circuit of the embodiment, since $k=-1$, and $a=b=c=d=e=f=g=h=j=m=1$, it follows that the relationship $a \times b \times c \times d \times e \times f \times g \times h \times j \times k \times m = -1$ holds. Hence, according to the filter circuit of the embodiment, an electric signal passing through the first bandpass filter 20 and an electric signal passing through the second bandpass filter 30 cancel each other out in a frequency region between the two pass band, thereby forming an attenuation pole. This makes it possible to obtain excellent passband characteristics in which an adequate amount of attenuation is ensured in the frequency region between the two pass band.

Fourth Embodiment

Figure 19:
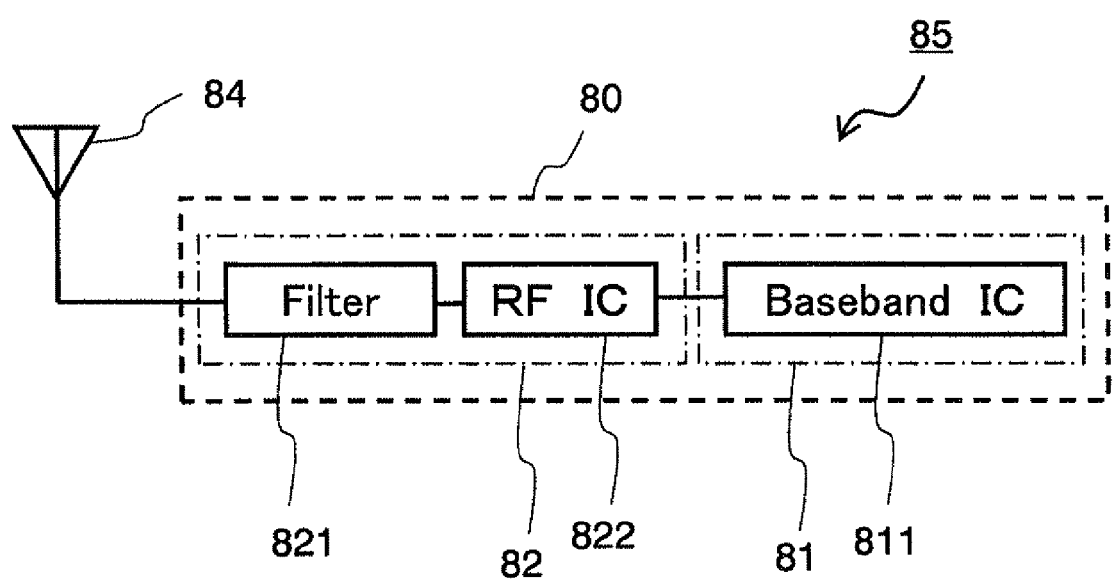
FIG. 19 is a block diagram schematically showing a wireless communication module and a wireless communication device in accordance with a fourth embodiment of the invention.

FIG. 19 is a block diagram showing a wireless communication module 80 and a wireless communication device 85 in accordance with a fourth embodiment of the invention.

The wireless communication module 80 of this embodiment comprises a baseband section 81 configured to process a baseband signal and an RF section 82 connected to the baseband section 81, and configured to process a signal obtained after modulation of a baseband signal and an RF signal before demodulation.

The RF section 82 includes a filter circuit 821 according to the invention as described heretofore. In the RF section 82, out of RF signals resulting from modulation of baseband signals or received RF signals, a signal lying in a frequency region outside the communication band is attenuated by the filter circuit 821.

To be specific, a baseband IC 811 is disposed in the baseband section 81, and, in the RF section 82, a RF IC 822 is so disposed as to lie between the filter circuit 821 and the baseband section 81. It is noted that another circuit may be interposed between these circuits.

By connecting an antenna 84 to the filter circuit 821 of the wireless communication module 80, the wireless communication device 85 of the embodiment capable of performing transmission and reception of RF signals, is configured.

According to the wireless communication module 80 and the wireless communication device 85 of the embodiment thus configured, it is possible to perform wave filtering on signals in two communication bands with use of the filter circuit 821 of the invention in which an adequate amount of attenuation is ensured in a frequency region between the two pass bands, and thereby provide compact wireless communication module and wireless communication device that afford high-quality communication performance.

Modified-Form Examples

The invention is not limited to the embodiments as described heretofore, and is thus susceptible of various changes and modifications without departing from the gist of the invention.

For example, in the foregoing embodiments, the second bandpass filter 30 is, as exemplified, provided with a half-wavelength resonator. Alternatively, the first bandpass filter 20 may be provided with a half-wavelength resonator. Both of the first bandpass filter 20 and the second bandpass filter 30 may be provided with a half-wavelength resonator. However, from the standpoint of filter circuit miniaturization, it is desirable to reduce the number of half-wavelength resonators to a minimum.

Further, in the filter circuit of the invention, as another resonator other than that constructed for example of a strip line or a microstrip line, a coaxial resonator or the like can be used as the resonator for constituting the resonator group.

REFERENCE SIGNS LIST

11: Input terminal
12: Output terminal
20: First bandpass filter
30: Second bandpass filter
21, 31: Resonator of input stage
22, 32: Resonator of output stage

The invention claimed is:
1. A filter circuit having two pass bands, comprising:
a first bandpass filter having a pass band of a first frequency band; and
a second bandpass filter having a pass band of a second frequency band which is higher in frequency than the first frequency band, the first bandpass filter and the second bandpass filter being connected in parallel with each other,
each of the first bandpass filter and the second bandpass filter comprising at least a resonator group composed of a plurality of resonators arranged in orderly sequence so as to be coupled to each other to form a pass band; an input terminal coupled to a resonator on an input stage of the plurality of resonators of the resonator group; and an output terminal coupled to a resonator on an output stage of the plurality of resonators of the resonator group, each of the resonator groups of the first and second band pass filters being composed of at least one of one or more quarter-wavelength resonators which are operable to connect to a standard potential at one end and one or more half-wavelength resonators which are opened at both ends, the resonator group of at least one of the first bandpass filter and the second bandpass filter comprising both the one or more quarter-wavelength resonators and the one or more half-wavelength resonators, the respective half-wavelength resonators of the first and second band pass filters having one end coupled to an adjacent resonator at the input terminal side or to the input terminal and having other end coupled to an adjacent resonator at the output terminal side or to the output terminal, a number of the half-wavelength resonators included in the resonator group of the first bandpass filter and a number of the half-wavelength resonators included in the resonator group of the second bandpass filter being so determined as to fulfill a condition given in an equation form as: $a \times b \times c \times d \times e \times f \times g \times h \times j \times k \times m = -1$, where "a" represents 1 when a number of the half-wavelength resonators included in the resonator group of the first bandpass filter is 0 or an even number, or represents −1 when the number thereof is an odd number; "b" represents 1 when a number of pairs of adjacent resonators coupled mainly inductively each other in the first bandpass filter is 0 or an even number, or represents −1 when the number thereof is an odd number; "c" represents 1 when coupling between the resonator on the input stage and the input terminal in the first bandpass filter is based mainly on capacitive coupling, or represents −1 when the coupling is based mainly on inductive coupling; and "d" represents 1 when coupling between the resonator on the output stage and the output terminal in the first bandpass filter is based mainly on capacitive coupling, or represents −1 when the coupling is based mainly on inductive coupling, where "e" represents 1 when a number of attenuation poles in a transmission characteristic of the first bandpass filter resulting from a phase difference between signals to be transmitted over a plurality of paths, which are formed in a frequency region between the first frequency band and a third frequency band lying between the first frequency band and the second frequency band, is 0 or an even number, or represents −1 when the number thereof is an odd number, where "f" represents 1 when a number of the half-wavelength resonators included in the resonator group of the second bandpass filter is 0 or an even number, or represents −1 when the number thereof is an odd number; "g" represents 1 when a number of pairs of adjacent resonators coupled mainly inductively each other in the second bandpass filter is 0 or an even number, or represents −1 when the number thereof is an odd number; "h" represents 1 when coupling between the resonator on the input stage and the input terminal in the second bandpass filter is based mainly on capacitive coupling, or represents −1 when the coupling is based mainly on inductive coupling; "j" represents 1 when coupling between the resonator on the output stage and the output terminal in the second bandpass filter is based mainly on capacitive coupling, or represents −1 when the coupling is based mainly on inductive coupling; and "k" represents 1 when a number of the resonators included in the resonator group of the second bandpass filter is an even number, or represents −1 when the number thereof is an odd number, and where "m" represents 1 when a number of attenuation poles in a transmission characteristic of the second bandpass filter resulting from a phase difference between signals to be transmitted over a plurality of paths, which are formed in a frequency region between the third frequency band and the second frequency band, is 0 or an even number, or represents −1 when the number thereof is an odd number.

2. A wireless communication module, comprising:
an RF section including the filter circuit according to claim 1; and
a baseband section connected to the RF section.

3. A wireless communication device, comprising:
the wireless communication module according to claim 2; and
an antenna connected to the RF section.

* * * * *